United States Patent
Xiang et al.

(10) Patent No.: US 11,909,408 B2
(45) Date of Patent: Feb. 20, 2024

(54) SERDES MODULE CLOCK NETWORK ARCHITECTURE

(71) Applicant: SHENZHEN PANGO MICROSYSTEMS CO., LTD., Shenzhen (CN)

(72) Inventors: Shengwen Xiang, Shenzhen (CN); Ying Liu, Shenzhen (CN)

(73) Assignee: SHENZHEN PANGO MICROSYSTEMS CO., LTD., Guangdong Province (CN)

( * ) Notice: Subject to any disclaimer, the term of this patent is extended or adjusted under 35 U.S.C. 154(b) by 0 days.

(21) Appl. No.: 17/907,099

(22) PCT Filed: Mar. 24, 2021

(86) PCT No.: PCT/CN2021/082543
§ 371 (c)(1),
(2) Date: Sep. 23, 2022

(87) PCT Pub. No.: WO2022/126891
PCT Pub. Date: Jun. 23, 2022

(65) Prior Publication Data
US 2023/0106133 A1 Apr. 6, 2023

(30) Foreign Application Priority Data
Dec. 18, 2020 (CN) .......................... 202011504057.7

(51) Int. Cl.
*H03L 7/197* (2006.01)
*G06F 1/10* (2006.01)

(52) U.S. Cl.
CPC .............. *H03L 7/1974* (2013.01); *G06F 1/10* (2013.01)

(58) Field of Classification Search
None
See application file for complete search history.

(56) References Cited

U.S. PATENT DOCUMENTS 8,228,102 B1 * 7/2012 Pham ...................... H03L 7/183
327/147

* cited by examiner

*Primary Examiner* — Cassandra F Cox

(57) ABSTRACT

A SerDes module clock network architecture comprises, a reference clock input port, a plurality of data transmission channels, several user logic interfaces, several frequency division branches and a phase locked loop. The reference lock input port receives an input clock and conveys the input clock to the phase locked loop, the phase locked loop receives the input lock and outputs a PLL output clock signal, the PLL output clock signal is conveyed to the plurality of data transmission channels, and the PLL output clock signal is conveyed to the frequency division branches, and after frequency division, user interface clocks are output and conveyed to the user logic interfaces. When the PLL output clock signal in a SerDes is provided to an internal dedicated channel, several frequency division branches are also divided, and after frequency division, the signal is output to the user logic interfaces for use by an FPGA.

5 Claims, 1 Drawing Sheet

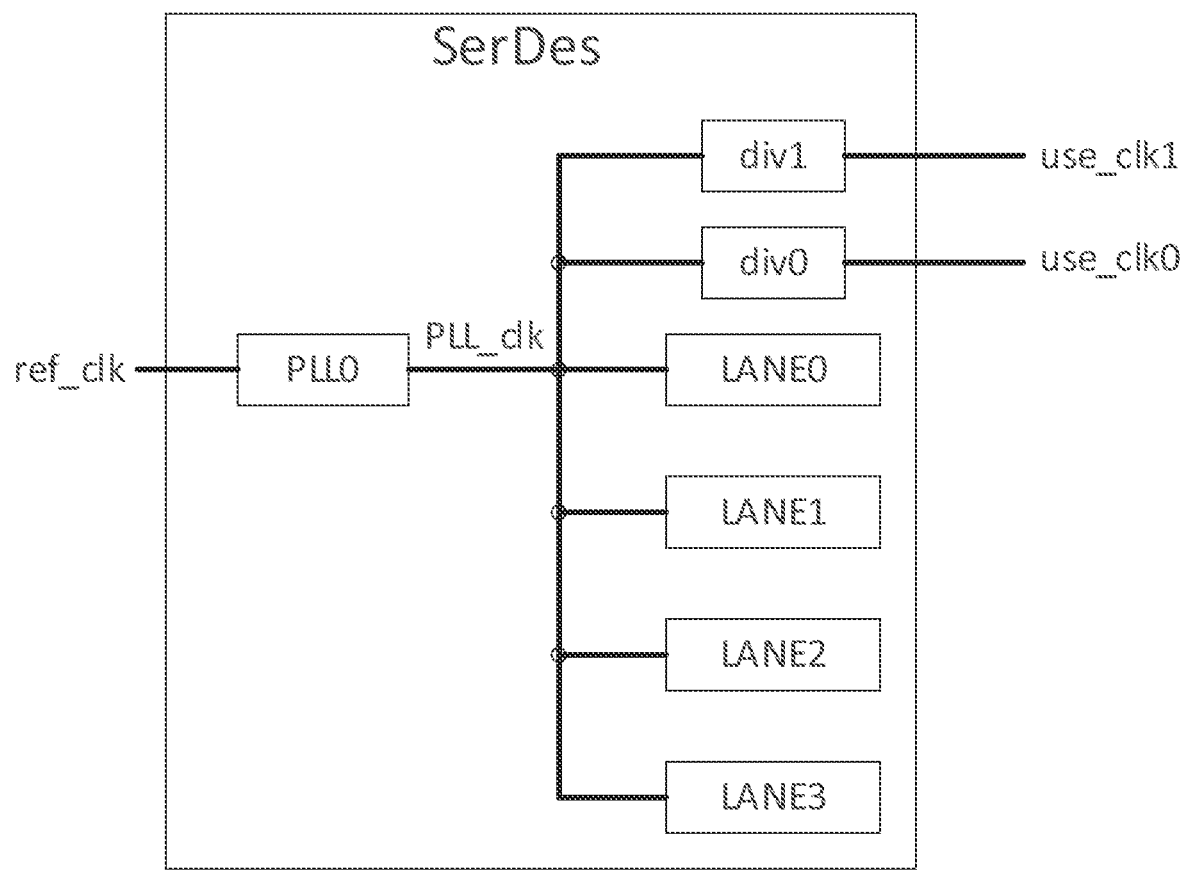

SERDES MODULE CLOCK NETWORK ARCHITECTURE

FIELD OF THE INVENTION

This invention relates to the field of integrated circuit chip technology, in particular to a SerDes module clock network architecture.

BACKGROUND

Currently, the PLL(Phase Locked Loop) inside SerDes (Serializer/Deserializer) is used as a dedicated clock for the internal channel of SerDes, the PLL cannot be independent of the channel and cannot be used as an independent output clock for FPGA(Field Programmable Gate Array).

The disadvantage of the existing technology is that the current clock network architecture of SerDes limits the functional application of PLL and can only be used in combination with the internal channel of SerDes, which limits the use of scenarios where FPGA needs multiple PLLs to generate multiple clocks, especially when SerDes function is not used, resulting in a waste of PLL resources inside SerDes.

SUMMARY

An object of the invention is to provide a SerDes module clock network architecture to make full use of the PLL clock resources inside SerDes.

In order to achieve the above object, the invention provides a SerDes module clock network architecture, comprising a reference clock input port, a plurality of data transmission channels, several user logic interfaces, several of frequency division branches and a phase locked loop; in which the reference clock input port receives an input clock and conveys the input clock to the phase locked loop, the phase locked loop receives the input clock and outputs a PLL output clock signal, the PLL output clock signal is conveyed to the plurality of data transmission channels, and the PLL output clock signal is conveyed to the frequency division branches, and after frequency division, user interfaces clock are output and conveyed to the user logic interfaces; the frequency division branches are in one-to-one correspondence with the user logic interfaces.

Preferably, the number of frequency division branches is 2 and the number of user logic interfaces is 2.

Preferably, the frequency division coefficient of each frequency division branch is independent.

Preferably, the frequency division coefficient is fractional frequency division or integer frequency division.

Preferably, the frequency division coefficient can be configured by parameters.

Preferably, the phase locked loop and the plurality of data transmission channels are separate structures.

The beneficial effect of this invention is that a SerDes module clock network architecture is provided, when the PLL output clock signal in a SerDes is provided to an internal dedicated channel (data transmission channel), several frequency division branches are also divided, and after frequency division, the signal is output to the user logic interfaces for use by an FPGA.

BRIEF DESCRIPTION OF THE DRAWINGS

FIG. 1 is the structure diagram of SerDes module clock network architecture in the embodiment of the invention.

DETAILED DESCRIPTION OF THE INVENTION

In order to make the purpose, technical solution and advantages of this specification clearer, the technical solution of this specification will be clearly and completely described in combination with the specific implementation examples of this specification and the corresponding appended drawings. Obviously, the described implementation is only part of this specification, not all of it. Based on the embodiments in this specification, all other embodiments obtained by ordinary technicians in the art without creative work belong to the scope of protection in this specification. It should be noted that the embodiments and features in the embodiments in the present invention can be combined with each other without conflict.

The terms "first", "second" and "third" in the description, claims and the above drawings of the invention are used to distinguish different objects, rather than to describe a specific order. In addition, the term "includes" and any variations thereof are intended to cover non exclusive inclusion. For example, a process, method, system, product or equipment containing a series of steps or units is not limited to the listed steps or units, but optionally also includes the steps or units not listed, or optionally includes other steps or units fixed to these processes, methods, products or equipment.

The embodiment of the invention provides a SerDes module clock network architecture, comprising a reference clock input port, a plurality of data transmission channels, several user logic interfaces, several frequency division branches and a phase locked loop.

The reference clock input port receives an input clock and conveys the input clock to the phase locked loop, the phase locked loop receives the input clock and outputs a PLL output clock signal, the PLL output clock signal is conveyed to the plurality of data transmission channels, and the PLL output clock signal is conveyed to the frequency division branches, and after frequency division, user interface clocks are output and conveyed to the user logic interfaces; the frequency division branches are in one-to-one correspondence with the user logic interfaces.

In the SerDes module clock network architecture of the invention, when the PLL output clock signal in a SerDes is provided to an internal dedicated channel (data transmission channel), several frequency division branches are also divided, and after frequency division, the signal is output to the user logic interfaces for use by an FPGA.

In one embodiment, the frequency division coefficient of each frequency division branch is independent.

Preferably, the frequency division coefficient is fractional frequency division or integer frequency division.

Preferably, the frequency division coefficient can be configured by parameters.

In one embodiment, the phase locked loop and the plurality of data transmission channels are separate structures. Due to the separation structure between the phase locked loop and multiple data transmission channels, the PLL can be called independently without the restriction of channel binding. Wherein, the frequency division branch is integrated into the phase locked loop as a part of the phase locked loop to serve as the clock output branch of the phase locked loop.

The SerDes module clock network architecture provided in the embodiment of the invention can make more full use of the PLL clock resources inside SerDes, which is very useful in scenarios where PLL resources are tight.

As shown in FIG. 1, another embodiment of the invention provides a SerDes module clock network architecture, comprising a reference clock input port ref_clk, a plurality of data transmission channels, several user logic interfaces use_clk, several frequency division branches and a phase locked loop PLL0.

In this embodiment, there are two user logic interfaces, which are user logic interface 1 use_clk1 and user logic interface 2 use_clk2 respectively; there are two frequency division branches, which are frequency division branch 1 div1 and frequency division branch 2 div2 respectively; there are 4 data transmission channels, which are LANE0, LANE1, LANE2 AND LANE3.

The reference clock input port ref_clk receives an input clock and conveys the input clock to the phase locked loop PLL0, the phase locked loop PLL0 receives the input clock and outputs the PLL output clock signal PLL_clk, the PLL output clock signal PLL_clk is conveyed to a plurality of data transmission channels, and the PLL output clock signal PLL_clk is conveyed to the frequency division branch 1 div1, and frequency division branch 2 div2, after frequency division, the user interface clock use_clk0 and use_clk1 are output and conveyed to the user logic interface 1 use_clk1 and user logic interface 2 use_clk2 respectively; the frequency division branches are in one-to-one correspondence with the user logic interfaces.

In the SerDes module clock network architecture of the invention, when the PLL output clock signal in a SerDes is provided to an internal dedicated channel, (data transmission channel), two frequency division branches are also divided, and after frequency division, the signal is output to the user logic interfaces for use by an FPGA.

Preferably, the frequency division coefficient is fractional frequency division or integer frequency division. Among them, the PLL is used for the clock output of the frequency division branch, the PLL has the function of outputting multi-channel clock and fractional frequency division. That is, the PLL can output fractional frequency division and integer frequency division.

Preferably, the frequency division coefficient can be configured by parameters. Specifically, the parameters are configured through the static register parameter setting value or through the register configuration interface.

In one embodiment, the PLL and the plurality of data transmission channels are separate structures. Due to the separation structure between the PLL and multiple data transmission channels, the PLL can be called independently without the restriction of channel binding. The frequency division branch is integrated into the PLL as a part of the PLL to serve as the clock output branch of the PLL.

The above is only the embodiment of the invention. It should be pointed out here that ordinary technicians in the art can make improvements without departing from the creative idea of the invention, but these belong to the protection scope of the invention.

What is claimed is:

1. A SerDes module clock network architecture, comprising a reference clock input port, a plurality of data transmission channels, several user logic interfaces, several frequency division branches and a phase locked loop; wherein
the reference clock input port receives an input clock and conveys the input clock to the phase locked loop;
the phase locked loop receives the input clock and outputs a PLL output clock signal;
the PLL output clock signal is conveyed to the plurality of data transmission channels;
the PLL output clock signal is conveyed to the frequency division branches, and after frequency division, user interface clocks are output and conveyed to the user logic interfaces, wherein each of the frequency division branches is associated with a frequency division coefficient, and the frequency division coefficient of each of the frequency division branches is independent; and
the frequency division branches are in one-to-one correspondence with the user logic interfaces.

2. The SerDes module clock network architecture according to claim 1, wherein the number of frequency division branches is 2 and the number of user logic interfaces is 2.

3. The SerDes module clock network architecture according to claim 1, wherein the frequency division coefficient is fractional frequency division or integer frequency division.

4. The SerDes module clock network architecture according to claim 1, wherein the frequency division coefficient can be is configured by parameters.

5. The SerDes module clock network architecture according to claim 1, wherein the phase locked loop and the plurality of data transmission channels are separate structures.

* * * * *